(12) United States Patent
Lee

(10) Patent No.: US 7,045,411 B1
(45) Date of Patent: May 16, 2006

(54) SEMICONDUCTOR DEVICE HAVING A CHAIN GATE LINE STRUCTURE AND METHOD FOR MANUFACTURING THE SAME

(75) Inventor: Eun Suk Lee, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/131,164

(22) Filed: May 17, 2005

(30) Foreign Application Priority Data

Dec. 23, 2004 (KR) ............. 10-2004-0111390

(51) Int. Cl.
*H01L 21/8242* (2006.01)

(52) U.S. Cl. ............. 438/218; 438/294; 438/587; 438/618; 438/761; 257/206; 257/365; 257/401; 257/506

(58) Field of Classification Search ............. 438/218, 438/294, 587, 618, 761, 778, FOR. 355, 438/FOR. 368, FOR. 426; 257/206, 365, 257/368, 401, 506

See application file for complete search history.

(56) References Cited

U.S. PATENT DOCUMENTS 6,362,083 B1 * 3/2002 Mueller-Fiedler et al. .. 438/570
6,404,030 B1    6/2002 Ma et al.
6,570,199 B1 *  5/2003 Itoh ........................... 257/275
6,630,688 B1   10/2003 Kong et al.
6,762,477 B1 *  7/2004 Kunikiyo ................. 257/506
6,847,069 B1 *  1/2005 Park et al. ................ 257/288

* cited by examiner

*Primary Examiner*—George Fourson
*Assistant Examiner*—Joannie Adelle Garcia
(74) *Attorney, Agent, or Firm*—Marshall, Gerstein & Borun LLP

(57) ABSTRACT

Disclosed are a chain gate line structure of a semiconductor device, and a method for manufacturing the same. The semiconductor device having a gate line structure comprises device isolation films formed on a semiconductor substrate for defining active regions and inactive regions; stack type gate electrodes formed on top of the active regions of the semiconductor substrate; at least one layer of an interlayer insulating film formed on the entire surface of the resultant material having the stack type gate electrodes; gate contacts formed on contact holes of the interlayer insulating film and connected to the stack type gate electrodes; and chain type gate lines for connecting the gate contacts formed in the active regions arrayed in a row among a plurality of active regions on the top of the interlayer insulating film in a concave-convex type chain structure. The chain gate line structure can enlarge active regions of a cell in a longitudinal axis direction by changing gate lines of the cell from a serial array into a chain line structure by having stack type gate electrodes and chain type gate lines connected thereto, and accordingly can reduce the contact resistance of the cell.

6 Claims, 6 Drawing Sheets

SEMICONDUCTOR DEVICE HAVING A CHAIN GATE LINE STRUCTURE AND METHOD FOR MANUFACTURING THE SAME

BACKGROUND OF THE INVENTION

1. Field of the Invention

The present invention relates to a semiconductor device, and more particularly, to a semiconductor device having a chain gate line structure, which can reduce the contact resistance of a DRAM cell by increasing the active regions of the cell.

2. Description of Related Art

As the design rule of semiconductor devices gets smaller and become highly integrated, the size of the memory cell, such as a DRAM or the like, is gradually decreasing. For the high integration of semiconductor devices, researches on new materials associated with lithography, a cell structure, and wiring and physical properties researches associated with insulating films and the like are required, as well as research for increasing the contact critical dimension (CD) of a gate line, a bit line, and a capacitor.

FIG. 1 is a plan view showing a gate line structure and a contact structure of a semiconductor device in the prior art. FIG. 2 is a vertical cross sectional view of FIG. 1.

Referring to FIGS. 1 and 2, in a semiconductor device, such as a DRAM or the like having a gate line according to the prior art, device isolation films 12, such as shallow trench isolation (STI) films, for isolating active regions and inactive regions are formed on a semiconductor substrate 10. Gate electrodes 14 made of doped polysilicon, metal silicide, and the like are formed on top of the semiconductor substrate 10. Masks 16 made of insulating material are formed on top of the gate electrodes 14, and spacers 18 made of insulating material are formed on the side walls thereof. There is formed a landing plug 20 which is contacted perpendicularly to active regions of the substrate 10 and a bit line or storage nodes through a contact hole in an interlayer insulating film gap-filling the space between the spacers 18.

Though not shown in the drawings, a planarized interlayer insulating film is formed on the entire resultant material. A bit line connected to the landing plug 20 is formed thereon. Another planarized interlayer insulating film is formed on the entire resultant material having the bit line. Storage node contacts connected to the landing plug 20 are formed through a contact hole of the interlayer insulating film.

As shown in FIG. 1, the semiconductor device, such as a DRAM or the like, having such construction according to the prior art has a structure in which gate lines of gate electrodes 14 are arrayed in series. At this point, reference numeral 10 of FIG. 1 denotes active regions of the semiconductor substrate in which no device isolation films are formed.

However, as the size of a DRAM cell gets smaller, the contact surface area between the landing plug 20 and the active regions of the semiconductor substrate 10, which makes the contact resistance larger and larger. Consequently, an increase in contact resistance of a cell is causing weakening of the tWR (time of Writing Recovery) property desired by a DRAM cell.

SUMMARY OF THE INVENTION

It is an object of the present invention to provide a semiconductor device having a chain gate line structure, which can enlarge active regions of a cell in a longitudinal axis direction by changing gate lines of the cell from a serial array into a chain line structure by having stack type gate electrodes and chain type gate lines connected thereto, and accordingly can reduce the contact resistance of the cell, and a method for manufacturing the same.

To achieve the above object of the present invention, there is provided a semiconductor device having a gate line structure, comprising: device isolation films formed on a semiconductor substrate for defining active regions and inactive regions; stack type gate electrodes formed on top of the active regions of the semiconductor substrate; at least one layer of an interlayer insulating film formed on the entire surface of the resultant material having stack type gate electrodes; gate contacts formed on the contact holes of the interlayer insulating film and connected to the stack type gate electrodes; and chain type gate lines for connecting the gate contacts formed in the active regions arrayed in a row among a plurality of active regions on the top of the interlayer insulating film in a concave-convex type chain structure.

To achieve the above object of the present invention, there is provided a method for manufacturing a chain gate line structure of a semiconductor device, the semiconductor device having gate lines, comprising the steps of: forming device isolation films on a semiconductor substrate for defining active regions and inactive regions; forming stack type gate electrodes on top of the active regions of the semiconductor substrate; forming at least one layer of an interlayer insulating film on the entire surface of the resultant material having the stack type gate electrodes; forming gate contacts connected to the stack type gate electrodes through contact holes of the interlayer insulating film; and forming chain type gate lines for connecting the gate contacts in the active regions arrayed in a row among the plurality of active regions on the top of the interlayer insulating film in a concave-convex type chain structure.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
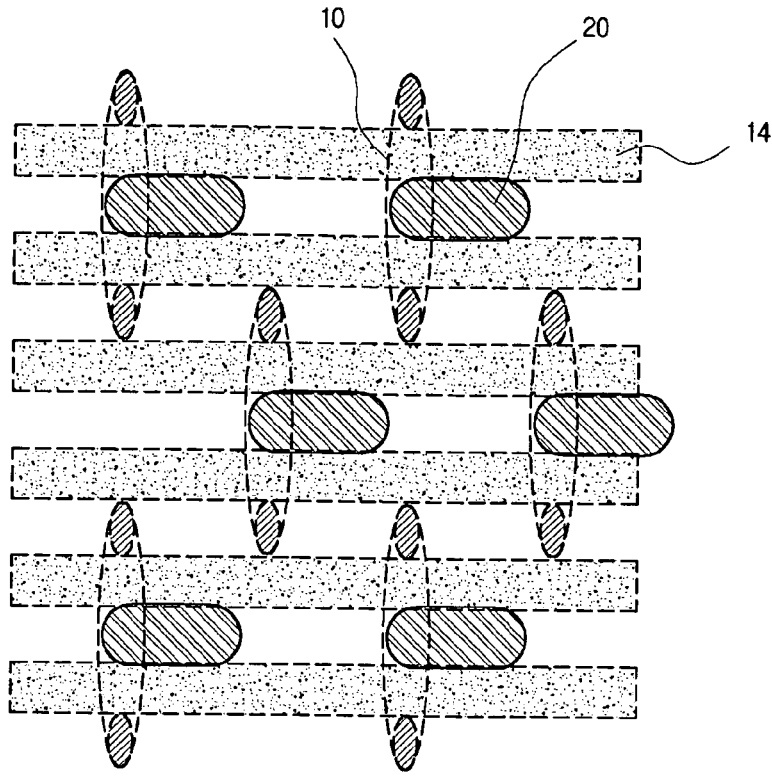
FIG. 1 is a plan view showing a gate line structure and a contact structure of a semiconductor device in the prior art.
Figure 2:
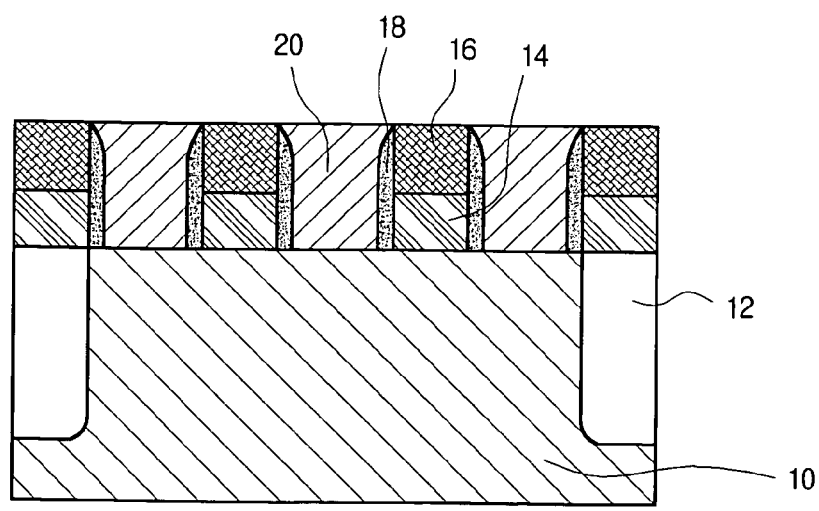
FIG. 2 is a vertical cross sectional view of FIG. 1.

A preferred embodiment of the present invention will now be described in detail with reference to the accompanying drawings so that those skilled in the art may readily practice this invention.

In the drawings, thickness is shown to be greater in order to clearly represent multiple layers and areas. Throughout the specification, like parts are denoted by like reference numerals.

Figure 3:
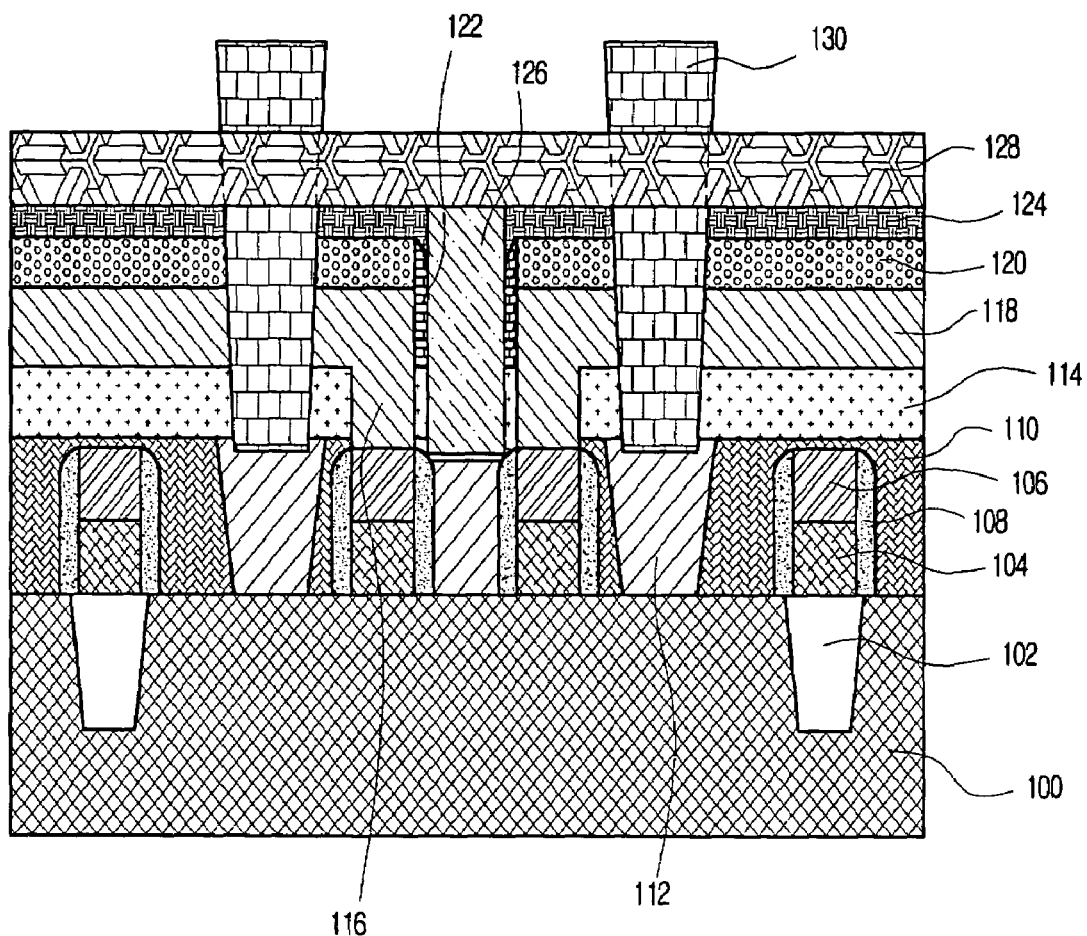
FIG. 3 is a vertical cross sectional view showing a chain gate line structure of a semiconductor device according to the present invention.

FIG. 3 is a vertical cross sectional view showing a chain gate line structure of a semiconductor device according to the present invention.

Referring to FIG. 3, in a semiconductor device, such as a DRAM or the like having chain type gate lines according to the present invention, device isolation films 102, such as shallow trench isolation (STI) films, and the like, are formed on a semiconductor substrate 100. Stack type gate electrodes 104 made of doped polysilicon, metal silicide, etc are formed on top of the semiconductor substrate 100. Masks 106 made of insulating material are formed on the top of the stack type gate electrodes 104, and spacers 108 made of an insulating material are formed on the side walls thereof. There is formed a landing plug 112 which is contacted perpendicularly to active regions of the substrate 100 and a bit line 128 or storage node contacts 130 through a contact hole in an interlayer insulating film 110 gap-filling the space between the spacers 108.

Figure 6A:
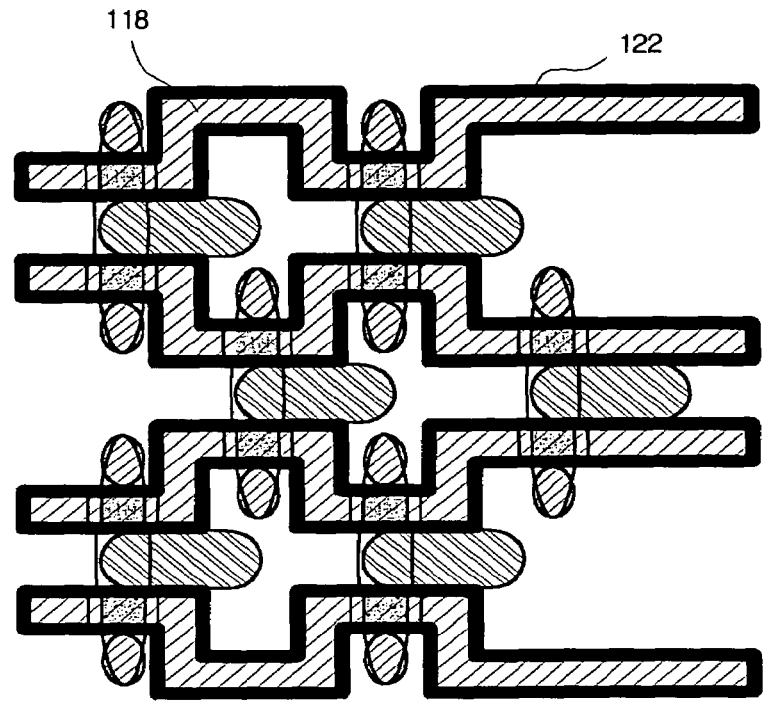
FIGS. 6a and 6b are view showing a process of manufacturing chain type gate lines connected to the contacts of the stack type gate electrodes of the semiconductor substrate according to the present invention.
Figure 7A:
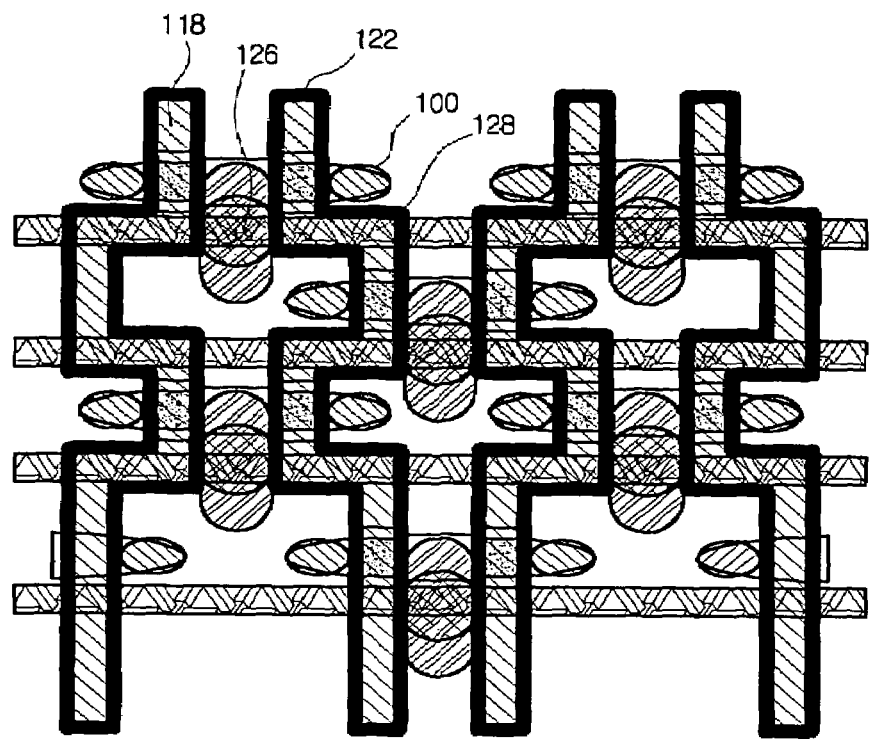
FIGS. 7a and 7b are views showing a process of manufacturing a bit line of the semiconductor device according to the present invention.

A planarized interlayer insulating film 114 is formed on the entire surface of the landing plug 112 and interlayer insulating film 110, and on the top thereof, there are formed gate contacts 116 connected to the stack type gate electrodes 104 through the contact hole in the interlayer insulating film 114. And, chain type gate lines 118 vertically connecting the gate contacts 116 are formed on top of the interlayer insulating film 114, hard masks 120 are formed thereon, and spacers 122 are formed on the side walls thereof. At this time, the chain type gate lines 118 are not arrayed in series as shown in FIGS. 6a and 7a, but have a concave-convex type chain line structure in which the chain type gate lines 118 are connected to the plurality of stack type gate electrodes 104 of the active regions of the semiconductor substrate.

A planarized interlayer insulating film 124 is formed on the entire surface of the resultant material having the chain type gate lines 118, a bit line contact 126 connected to the bit line landing plug 112 through contact holes in the interlayer insulating films 124 and 114 is formed, and a bit line 128 is formed on top of the interlayer insulating film 124.

Further, a planarized interlayer insulating film (not shown) is formed on the entire surface of the resultant material having the bit line 128, and storage node contacts 130 connected to the storage node landing plug 112 through another contact hole in the interlayer insulating films are formed thereon.

Therefore, the gate lines in the semiconductor device, such as a DRAM cell or the like, of the present invention can increase the active region of the cell because active regions of adjacent cells can be overlapped more than in the prior art by a chain gate line structure by having stack type gate electrodes 104 formed in the active regions of the semiconductor substrate having chain type gate lines 118 connected to the stack type gate electrodes 104 through gate contacts 116. Accordingly, the size of the landing plug of the cell can be increased so as to reduce the corresponding contact resistance.

Next, a process for manufacturing a semiconductor device such as a DRAM cell or the like according to the present invention will be explained by way of example with reference to FIGS. 4 to 7.

Figure 4A:
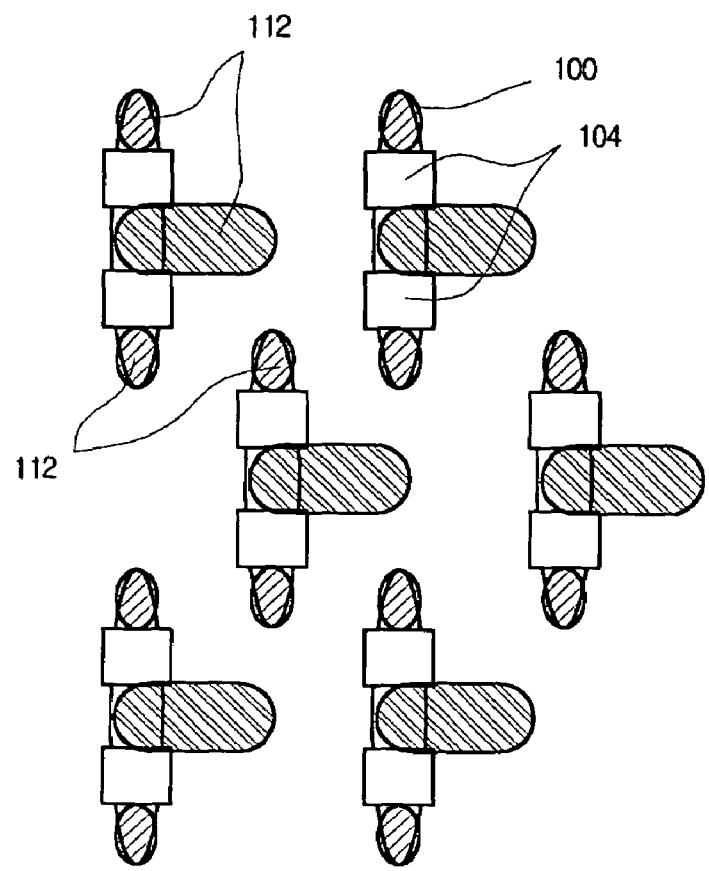
FIGS. 4a and 4b are views showing a process for manufacturing stack type gate electrodes of the semiconductor device according to the present invention.
Figure 4B:
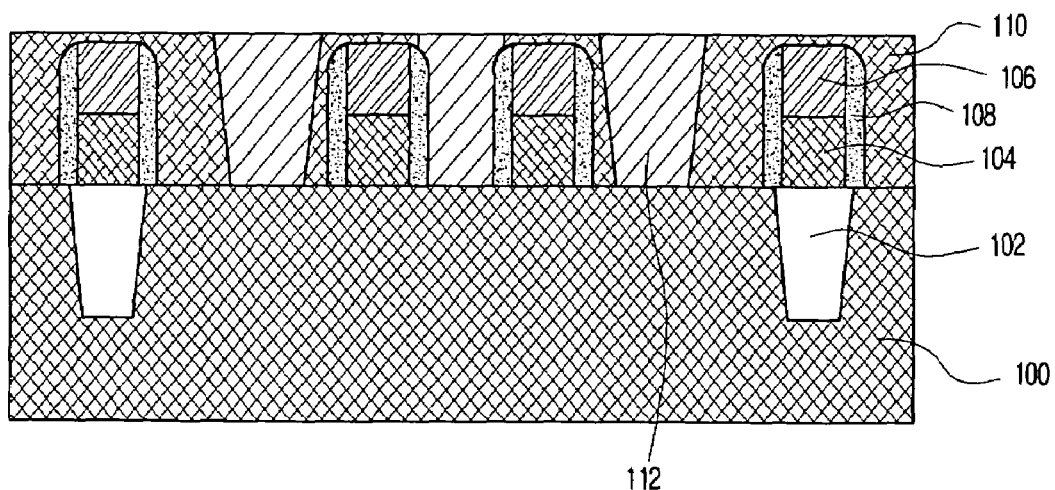

FIGS. 4a and 4b are views showing a process for manufacturing stack type gate electrodes of the semiconductor device according to the present invention.

As shown in FIGS. 4a and 4b, device isolation films 102, such as a STI or the like, for defining active region and inactive region are formed on a silicon substrate as a semiconductor substrate 100, and doped polysilicon, metal silicide, or the like are stacked on top of the semiconductor substrate 100 and patterned into a stack type structure, thereby forming stack gate electrodes 104. At this time, hard masks 106 made of insulating material may be additionally formed on top of the stack type gate electrode 104, and spacers 108 made of insulating material may be additionally formed on side walls of thereof.

Though not shown in the drawings, an n-type or p-type dopant is ion-implanted into the semiconductor substrate 100 exposed by the stack gate electrodes 104 and the spacers 108 to form source/drain regions.

An interlayer insulating film 110 for gap-filling the space between the spacers 108 is formed on the entire surface of the resultant material. Contact holes, through which active regions for the source/drain regions of the semiconductor substrate 100 are opened, are formed on the interlayer insulating film. The corresponding contact holes are gap-filled with conductive material, for example, a doped polysilicon film, and then the surfaces thereof are planarized by a chemical mechanical polishing (CMP) process, thereby forming a landing plug 112 that is to be vertically connected to a bit line or storage node contacts later.

The plurality of active regions of the semiconductor substrate 100 of this invention is arrayed in a row. When the active region of a certain array is overlapped with the active region of another array, the position of the landing plug 112 of the active regions overlapped with each other is not parallel as in the prior art but is in a zigzag fashion. Hence, the active regions 100 of the semiconductor substrate of this invention can be enlarged because the longitudinal axis (lengthwise direction) can be further enlarged compared to the prior art. Except, it should be noted that the longitudinal axis of the active regions are increased or that the contact size is increased with a contact margin enough not to generate a bridge between the bit line contact and the storage node landing plug.

Figure 5A:
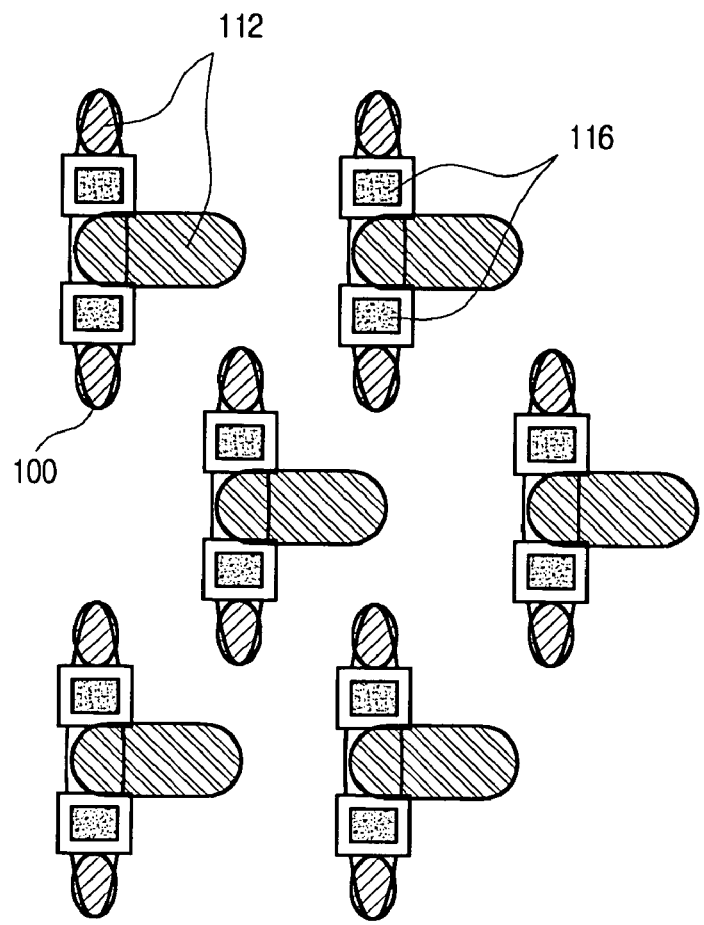
FIGS. 5a and 5b are views showing a process for manufacturing contacts connected to the stack type gate electrodes of the semiconductor substrate according to the present invention.
Figure 5B:
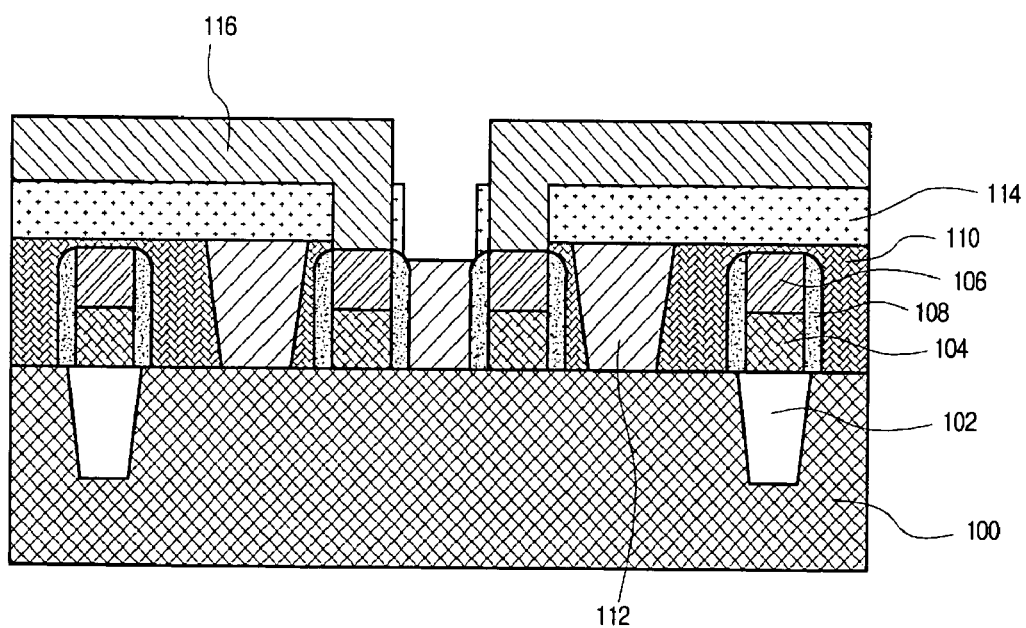

FIGS. 5a and 5b are views showing a process for manufacturing contacts connected to the stack type gate electrodes of the semiconductor substrate according to the present invention.

As shown in FIGS. 5a and 5b, an interlayer insulating film 114 is formed on the entire surface of the landing plug 112 and interlayer insulating film 110. The interlayer insulating film 114 and the hard masks 106 are etched so as to form contact holes for opening the stack type gate electrodes 104. The contact holes are gap-filled with a doped polysilicon film as conductive material, and then the surfaces thereof are planarized by a chemical mechanical polishing process, thereby forming gate contacts 116 to be connected to the stack type gate electrodes 104. At this time, the thickness of the interlayer insulating film 114 is set in the range from 2000 to 50000 Å in order to obtain an interlayer insulation between the stack type gate electrodes 104 and chain type gate lines to be formed later.

Figure 6B:
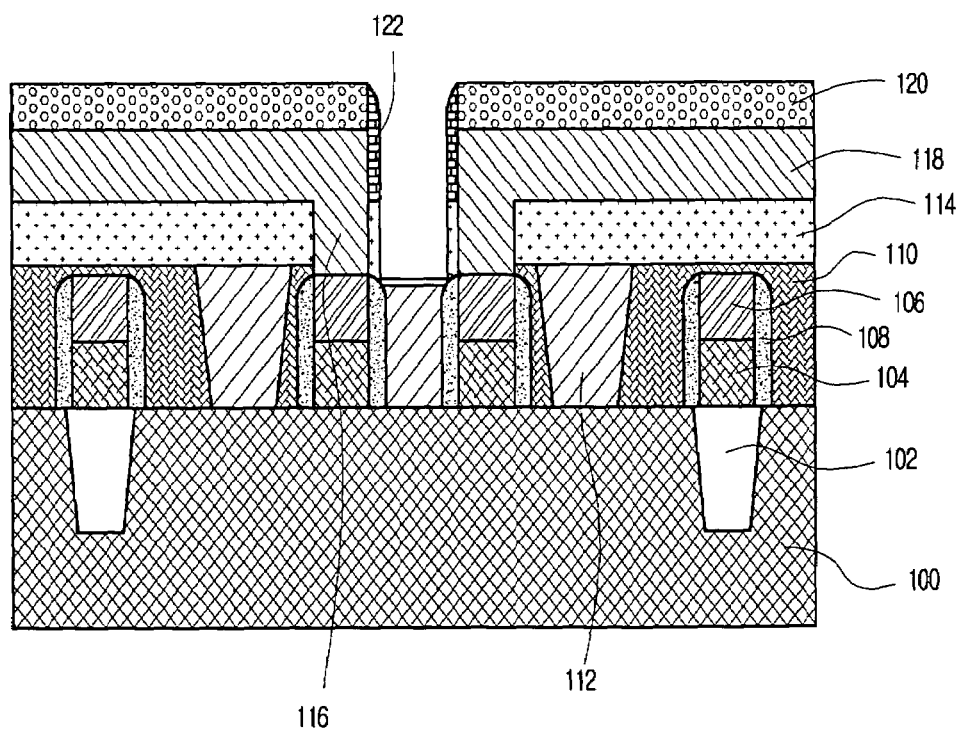

FIGS. 6a and 6b are view showing a process of manufacturing chain type gate lines connected to the contacts of the stack type gate electrodes of the semiconductor substrate according to the present invention.

As shown in FIGS. 6a and 6b, a conductive material, for example, doped polysilicon, tungsten, aluminum, and the like are deposited at 50 to 5000 Å on top of the planarized interlayer insulating film 114, and patterned by a dry etching process using a chain type line mask, thereby forming chain type gate lines 118 vertically connected to the gate contacts 116. At this time, hard masks 120 are may be additionally formed on the top surface of the chain type gate lines 118, and spacers 122 may be additionally formed on side walls thereof. Subsequently, the chain type gate lines 118 are not arrayed in series with respect to the plurality of active regions of the semiconductor substrate, but arrayed in a concave-convex type chain line structure with respect to the active regions arrayed in a row.

Figure 7B:
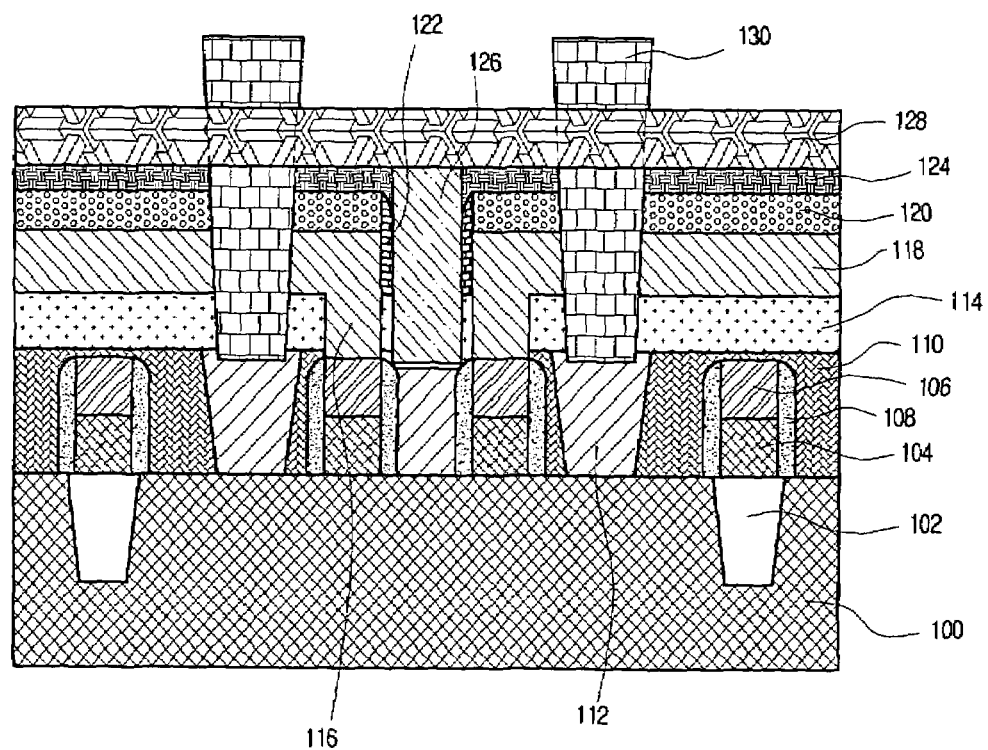

FIGS. 7a and 7b are views showing a process of manufacturing a bit line of the semiconductor device according to the present invention.

As shown in FIGS. 7a and 7b, an interlayer insulating film 124 is formed on the entire surface of the resultant material having the chain type gate lines 118. Contact holes are formed in the interlayer insulating films 124 and 114, gap-filled with conductive material, and the surfaces thereof are planarized by a chemical mechanical polishing process, thereby forming a bit line contact 126 vertically connected to the bit line landing plug 112. And, tungsten, aluminum, etc. are deposited on top of the planarized interlayer insulating film 124, and patterned, to thus form a bit line 128 connected to the bit line contact 126.

Then, an interlayer insulating film (not shown) is formed on the entire surface of the resultant material having the bit line 128. Contact holes are formed on the interlayer insulating film, gap-filled with conductive material, and then the surfaces thereof are planarized by a chemical mechanical polishing process, thereby forming storage node contacts 130 vertically connected to the storage node landing plug 112. Thereafter, the remaining manufacturing process of the DRAM cell is carried out.

While, in this preferred embodiment of the present invention, chain type gate lines 118 vertically connected to the stack type gate electrodes 104 and their gate contacts 116 are formed before forming a bit line, in another embodiment of this invention, the manufacturing process may be changed in a manner that gate contacts and chain type gate lines connected thereto are formed on an interlayer insulating film after forming a bit line 128.

While the present invention has been described with reference to a preferred embodiment thereof, it will be understood by those skilled in the art that various changes in form and details may be made therein without departing from the scope of the present invention as defined by the following claims.

As described above, the present invention can enlarge the active regions of a DRAM cell by changing gate lines of the cell from a serial array into a chain structure by having stack type gate electrodes and chain type gate lines connected thereto.

Therefore, the present invention can reduce contact resistance by increasing the size of a bit line or storage node contacts of the cell in the enlarged active regions, and accordingly can improve desired electrical characteristics like tWR in the DRAM cell.

What is claimed is:

1. A semiconductor device having gate line structure, comprising:
    (a) device isolation films formed on a semiconductor substrate for defining active regions and inactive regions;
    (b) stack type gate electrodes formed on top of the active regions of the semiconductor substrate defining a resultant structure;
    (c) at least one layer of an interlayer insulating film formed on an entire surface of the resultant structure having the stack type gate electrodes;
    (d) gate contacts formed on contact holes of the interlayer insulating film and connected to the stack type gate electrodes; and
    (e) chain type gate lines for connecting the gate contacts formed in the active regions arrayed in a row among the plurality of active regions on a top of the interlayer insulating film in a concave-convex type chain structure.

2. The chain gate line structure of claim 1, wherein the interlayer insulating film comprises a bit line contact and a bit line connected to the active regions, and the gate contacts and the chain gate lines are formed on the interlayer insulating film below the bit line.

3. The chain gate line structure of claim 1, wherein the interlayer insulating film comprises a bit line contact and a bit line connected to the active regions, and the gate contacts and the chain gate lines are formed on the interlayer insulating film above the bit line.

4. A method for manufacturing a semiconductor device having a gate line structure, the semiconductor device having gate lines, comprising the steps of:
    (a) forming device isolation films on a semiconductor substrate for defining active regions and inactive regions;
    (b) forming stack type gate electrodes on top of the active regions of the semiconductor substrate to define a resultant structure;
    (c) forming at least one layer of an interlayer insulating film on an entire surface of the resultant structure having the stack type gate electrodes;
    (d) forming gate contacts connected to the stack type gate electrodes through contact holes of the interlayer insulating film; and
    (e) forming chain type gate lines for connecting the gate contacts in the active regions arrayed in a row among the plurality of active regions on a top of the interlayer insulating film in a concave-convex type chain structure.

5. The method of claim 4, further comprising the step of forming a bit line contact and a bit line connected to the active regions on the interlayer insulating film after the step of forming chain gate lines.

6. The method of claim 4, further comprising the step of forming a bit line contact and a bit line connected to the active regions on the interlayer insulating film before the step of forming gate contacts.

* * * * *